(12) United States Patent
Nagano et al.

(10) Patent No.: US 7,218,002 B2
(45) Date of Patent: May 15, 2007

(54) ELECTRONIC DEVICE AND INTERMEDIATE PRODUCT OF ELECTRONIC DEVICE

(75) Inventors: Natsuyo Nagano, Osaka (JP); Masanori Hongo, Osaka (JP); Masami Fukuyama, Osaka (JP); Takashi Ogura, Kyoto (JP)

(73) Assignee: Sanyo Electric Co., Ltd., Osaka (JP)

( * ) Notice: Subject to any disclaimer, the term of this patent is extended or adjusted under 35 U.S.C. 154(b) by 155 days.

(21) Appl. No.: 11/030,288

(22) Filed: Jan. 7, 2005

(65) Prior Publication Data

US 2005/0151247 A1 Jul. 14, 2005

(30) Foreign Application Priority Data

Jan. 14, 2004 (JP) ............................. 2004-007346

(51) Int. Cl.
*H01L 23/04* (2006.01)

(52) U.S. Cl. ................... 257/730; 257/620; 257/680; 257/724

(58) Field of Classification Search ................ 257/680, 257/730, 620, 724
See application file for complete search history.

(56) References Cited

U.S. PATENT DOCUMENTS 6,856,026 B2 * 2/2005 Yamada et al. .............. 257/774

FOREIGN PATENT DOCUMENTS

| JP | 2976049 | 4/1994 |
|----|---------|--------|
| JP | 2002-353071 | 12/2002 |

* cited by examiner

*Primary Examiner*—Doug Menz
(74) *Attorney, Agent, or Firm*—Armstrong, Kratz, Quintos, Hanson & Brooks LLP

(57) ABSTRACT

The present invention provides an electronic device comprising a base substrate to be surface-mounted on a circuit board, one or more electronic component elements mounted on a surface of the base substrate and/or therein, an external electrode provided on an end portion of the base substrate and in the form of a post perpendicular to a rear surface of the base substrate for connecting the one or more electronic component elements to the circuit board. Furthermore, the base substrate is provided on its end portion with a slope crossing a side surface and a rear surface of the base substrate. A surface of the external electrode is exposed on the slope.

8 Claims, 7 Drawing Sheets

ELECTRONIC DEVICE AND INTERMEDIATE PRODUCT OF ELECTRONIC DEVICE

BACKGROUND OF THE INVENTION

1. Field of the Invention

The present invention relates to electronic devices including a base substrate to be surface-mounted on a circuit board, and a structure of a base substrate board serving as an intermediate product of the electronic device.

2. Description of Related Art

A portable telephone has, for example, an antenna duplexer mounted thereon for sharing one antenna with transmitting system and receiving system. The antenna duplexer is generally provided by a composite device of laminate type as shown in FIG. 9. With the composite device of laminate type, a plurality of ceramic layers 61 are laminated to constitute a base substrate 6 of laminate type, as shown in FIG. 10. An uppermost ceramic layer 61 has a plurality of chip components 7 mounted on a surface thereof. Intermediate ceramic layers 61 are each provided on a surface thereof with circuit elements including inductor patterns and capacitor patterns. The circuit elements and the chip components 7 are connected to each other to provide an antenna duplexer circuit.

Furthermore, with the composite device of laminate type, the base substrate 6 is provided on a side surface 60 with a plurality of external electrodes 20 in the form of a post perpendicular to the base substrate 6 in order to surface-mount the base substrate 6 on a circuit board, as shown in FIG. 9, to expose the external electrodes 20 on a rear surface of the base substrate 6.

When the composite device of laminate type is surface-mounted on the circuit board, the base substrate 6 has a side surface 60 formed with solder filets 30 for covering the external electrodes 20, as shown in FIG. 7(a). The solder fillets 30 mechanically join the base substrate 6 to the circuit board (not shown), and electrically connects the electrodes 20 to the circuit board (JP-B No. 2976049).

It has been required with ever increasing severity that electronic devices such as the composite device of laminate type be reduced in size. This gives rise to the important problem of downsizing a surface mounting area on the circuit board. However, the following problem arises. When the composite device of laminate type is surface-mounted on the circuit board as shown in FIG. 7(a), the solder filets 30 greatly project outward from the side surface 60 of the base substrate 6, resulting in enlarging a surface mounting area A by the amount of projection of the solder fillets 30.

SUMMARY OF THE INVENTION

An object of the present invention is to provide an electronic device and an intermediate product of the electronic device, which is adapted to render a surface mounting area smaller in size than conventionally.

The present invention provides an electronic device comprising a base substrate 1 to be surface-mounted on a circuit board 9. The base substrate 1 has one or more electronic component elements mounted on a surface and/or therein, and external electrodes 2 each formed in a post-shape perpendicular to a rear surface 19 of the base substrate and exposed on the rear surface 19 of the base substrate for connecting the one or more electronic component elements to the circuit board. The base substrate 1 has an end portion formed with a slope 11 crossing a side surface 10 and the rear surface 19 of the base substrate 1. The external electrodes 2 are exposed from the slope 11 to the rear surface 19.

Stated specifically, the slope 11 is provided by one of a flat plane, polygonal plane, and curved plane, or by a combination of these planes. The base substrate 1 comprises a laminate ceramic board having a plurality of ceramic layers as laminated, or comprises a single-layer board made of a synthetic resin or ceramic.

When the electronic device of the present invention is surface-mounted on the circuit board, the rear surface 19 of the base substrate 1 is opposed to a surface of the circuit board 9, and an end face of the external electrode 2 exposed on the rear surface 19 is joined to a pad on the circuit board 9 by soldering. Furthermore, the solder adheres along the surface of the external electrode 2 exposed on the slope 11 of the base substrate 1 to form a solder fillet 3 from the slope 11 of the base substrate 1 to the pad on the circuit board 9. In this case, the solder fillet 3 is entirely or almost entirely housed in a wedge-shaped space between the slope 11 of the base substrate 1 and the circuit board 9, and will not greatly project outward from the side surface 10 of the base substrate 1.

Further, the present invention provides an intermediate product of an electronic device including a base substrate 1 to be surface-mounted on a circuit board 9, one or more electronic component elements mounted on the base substrate 1, and a plurality of external electrodes 2 for connecting the electronic component elements to the circuit board, the intermediate product of the electronic device comprising a base substrate board 15 having base substrate unit portions 17 to serve as the base substrates 1 which portions are repeatedly formed on the same plane. The base substrate board 15 is provided, at the boundary or in the vicinity thereof between the base substrate unit portions 17, with a plurality of conductor filling portions 21 to serve as the external electrodes 2 and each in the form of a post perpendicular to a rear surface 19 of the base substrate board 15. The conductor filling portions 21 are exposed on the rear surface 19. The rear surface 19 is provided thereon with a V-shaped or U-shaped groove 16 in section for cutting partially the conductor filling portion 21 along the boundary between the base substrate unit portions 17. A surface of the conductor filling portion 21 is exposed on an inner surface of the groove 16.

With the intermediate product of the electronic device of the present invention, the base substrate board 15 is cut along the groove 16 at the deepest position every base substrate unit portion 17, to thereby obtain a plurality of base substrates 1 at the same time. For example, in the case where a plurality of conductor filling portions 21 are formed at the boundary between the base substrate unit portions 17 of the base substrate board 15, the conductor filling portions 21 are divided into two to provide the external electrodes 2 in the form of a post perpendicular to the rear surface 19 of the base substrate, to expose the external electrodes 2 on the rear surface 19 of the base substrate. Furthermore, a slope 11 crossing a side surface and rear surface of the base substrate is formed at an end portion of each base substrate 1 by an inner face of the groove 16, to expose a surface of the external electrode 2 on the slope 11.

The base substrate 1 thus obtained has one or more electronic component elements preliminarily incorporated therein, or one or more electronic component elements are mounted on the base substrate 1 obtained by cutting, whereby the electronic device of the present invention is completed.

The electronic device is surface-mounted on the circuit board as described above, with the result that the solder adheres along the surface of the external electrode 2 exposed on the slope 11 of the base substrate 1, forming a solder fillet 3 from the slope 11 of the base substrate 1 to the pad on the circuit board 9. Incidentally, the solder fillet 3 is entirely or almost entirely housed in a wedge-shaped space between the slope 11 of the base substrate 1 and the circuit board 9, and will not greatly project outward from the side surface 10 of the base substrate 1.

As stated above, with the electronic device and its intermediate product embodying the present invention, when the electronic device is surface-mounted on the circuit board, the solder fillet 3 will not greatly project outward from the side surface 10 of the base substrate 1, whereby the surface mounting area can be made smaller than conventionally.

BRIEF DESCRIPCITON OF THE DRAWINGS

FIG. 1 is a perspective view of an electronic device which is surface-mounted on a circuit board, according to the present invention;

FIGS. 2(a), 2(b) and 2(c) are each enlarged sectional view showing various shapes of a base substrate;

Figure 8A:
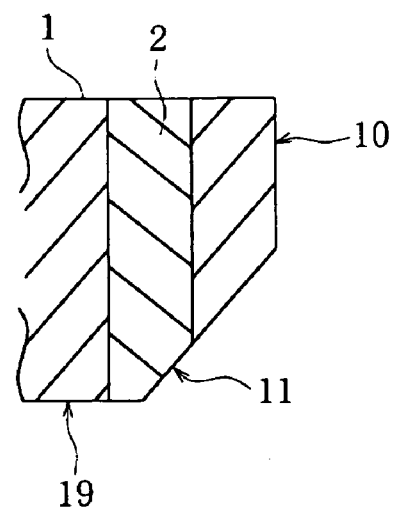
Figure 8B:
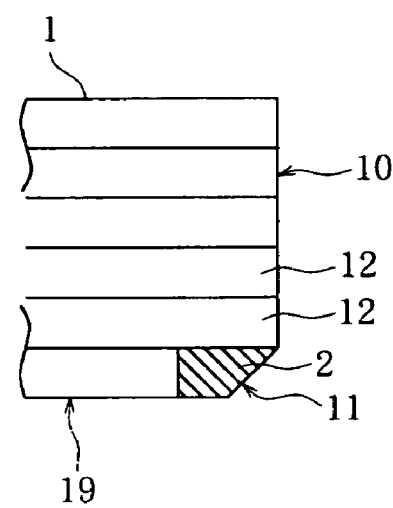
Figure 8C:
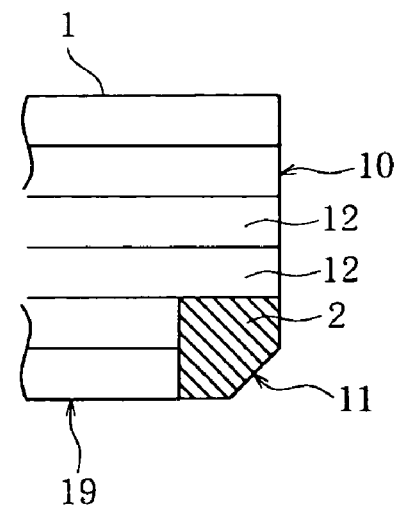
Figure 9:
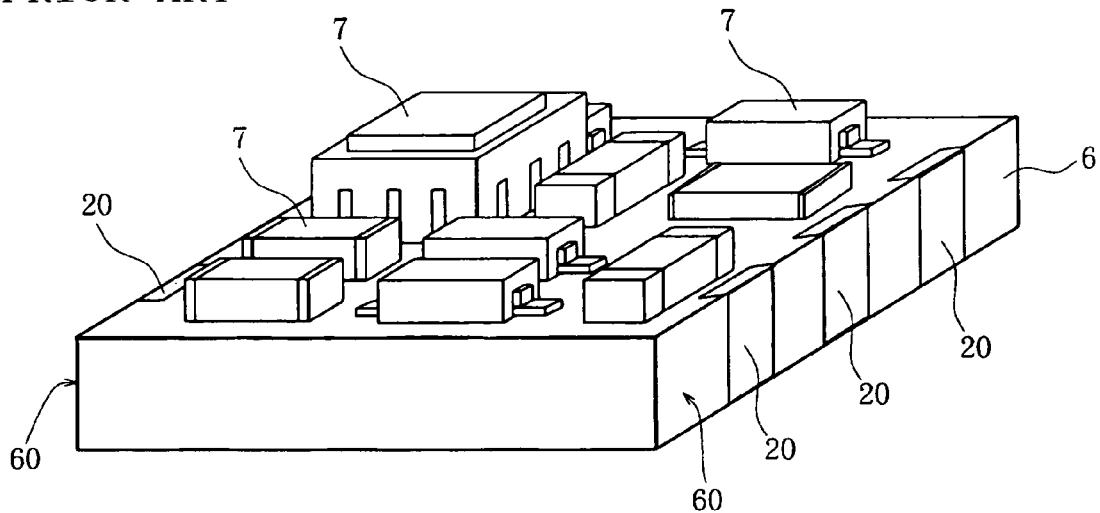
Figure 10:
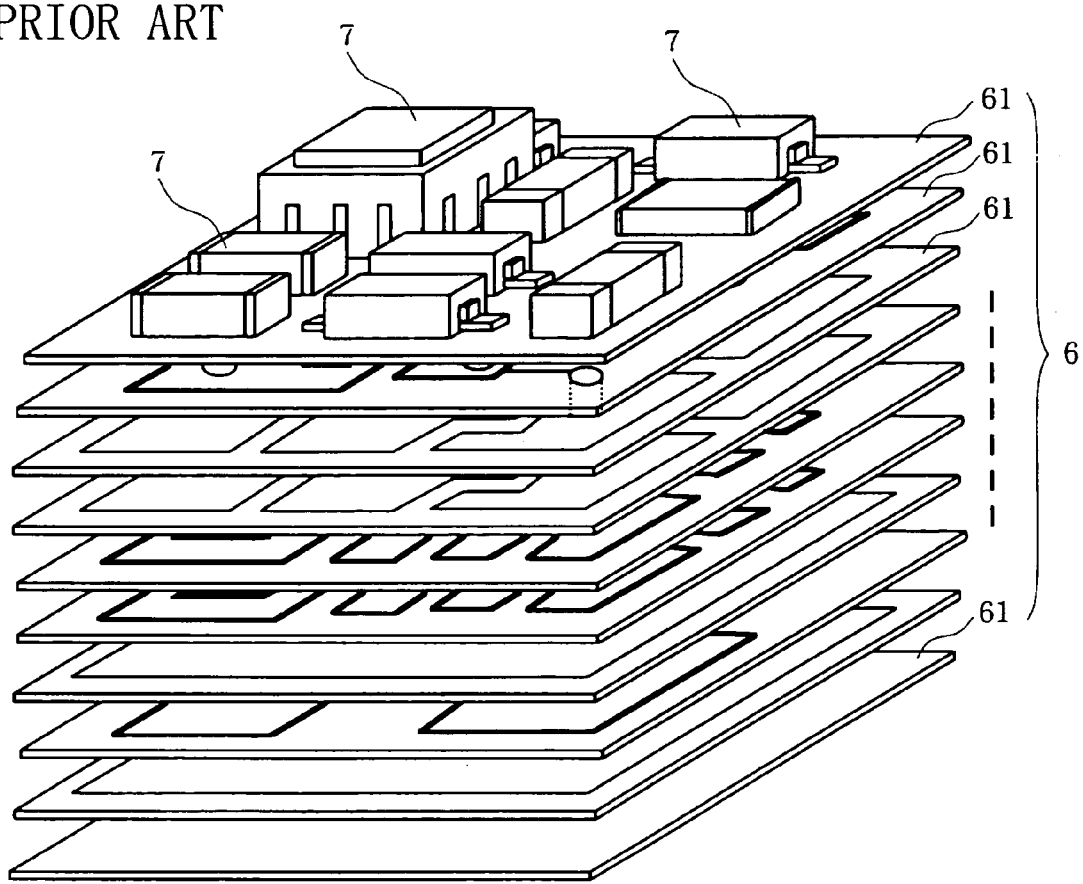

FIGS. 8(a), 8(b) and 8(c) are each sectional view showing another example of the base substrate;

FIG. 9 is a perspective view of a conventional electronic device;

FIG. 10 is an exploded perspective view of the electronic device.

DETAILED DESCRIPTION OF THE INVENTION

Figure 1:
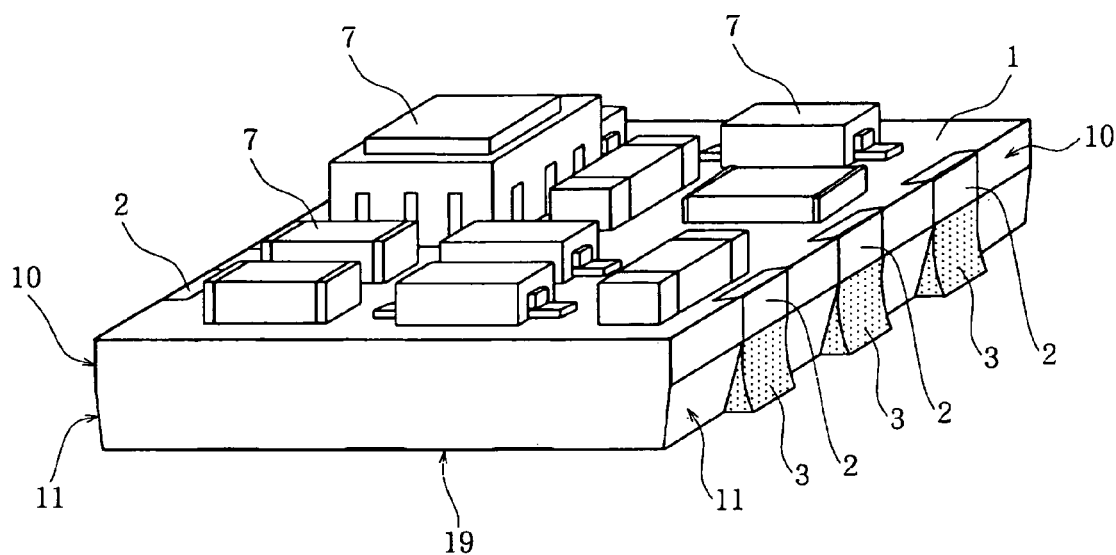

With reference to the drawings, the present invention will be specifically described below. An electronic device embodying the present invention comprises a plurality of chip components 7 mounted on a surface of a base substrate 1, as shown in FIG. 1. The base substrate 1 has a plurality of external electrodes 2 arranged on opposite end portions thereof, respectively. A slope 11 crossing a side surface 10 and a rear surface 19 is formed at opposite end portions of the base substrate 1. A surface of the external electrode 2 is exposed on the slope 11 (see FIG. 5(c)). In a state of surface mounting on the circuit board, a solder fillet 3 is formed to cover a surface of the external electrode 2 exposed on the slope 11, as shown in FIG. 1.

The base substrate 1 comprises a laminate ceramic board including a plurality of ceramic layers as laminated. Alternatively, the base substrate 1 comprises a single-layer board made of a synthetic resin such as a glass epoxy board, or ceramic.

Figures 2A, 2B, 2C:
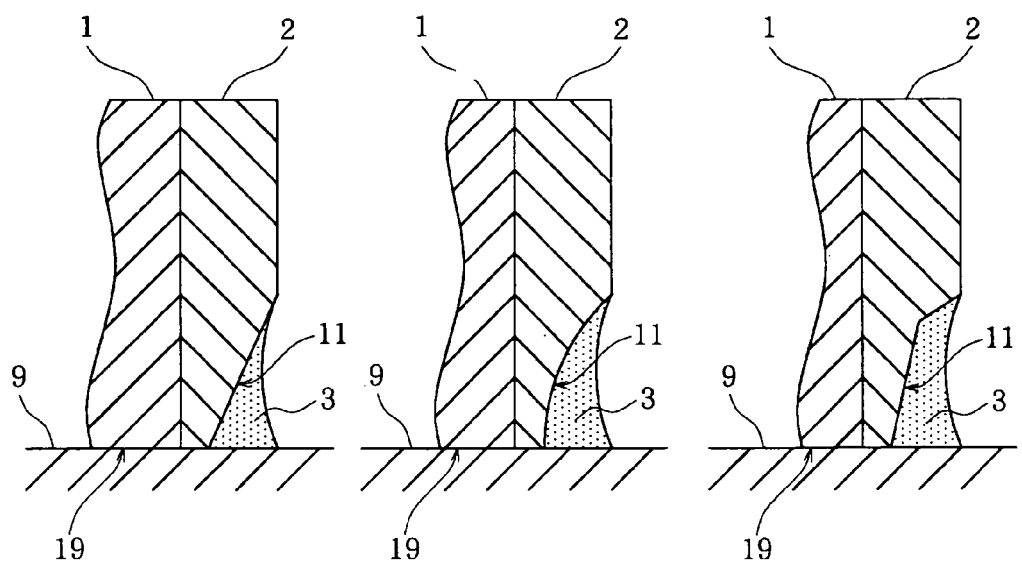

The slope 11 on the side surface 10 of the base substrate is formed with a flat plane as shown in FIG. 2(a), but can be formed with a recessed curved plane as shown in FIG. 2(b) or can be formed with a polygonal plane as shown in FIG. 2(c). Furthermore, the slope 11 can be formed with a combination of a flat plane and a curved plane. In either case of FIG. 2(a), FIG. 2(b), or FIG. 2(c), the solder fillet 3 is almost entirely housed in a wedge-shaped space between the slope 11 of the base substrate 1 and the surface of the circuit board 9, so that the amount of projection outward from the side surface 10 of the base substrate 1 is zero or extremely small.

Figure 5:
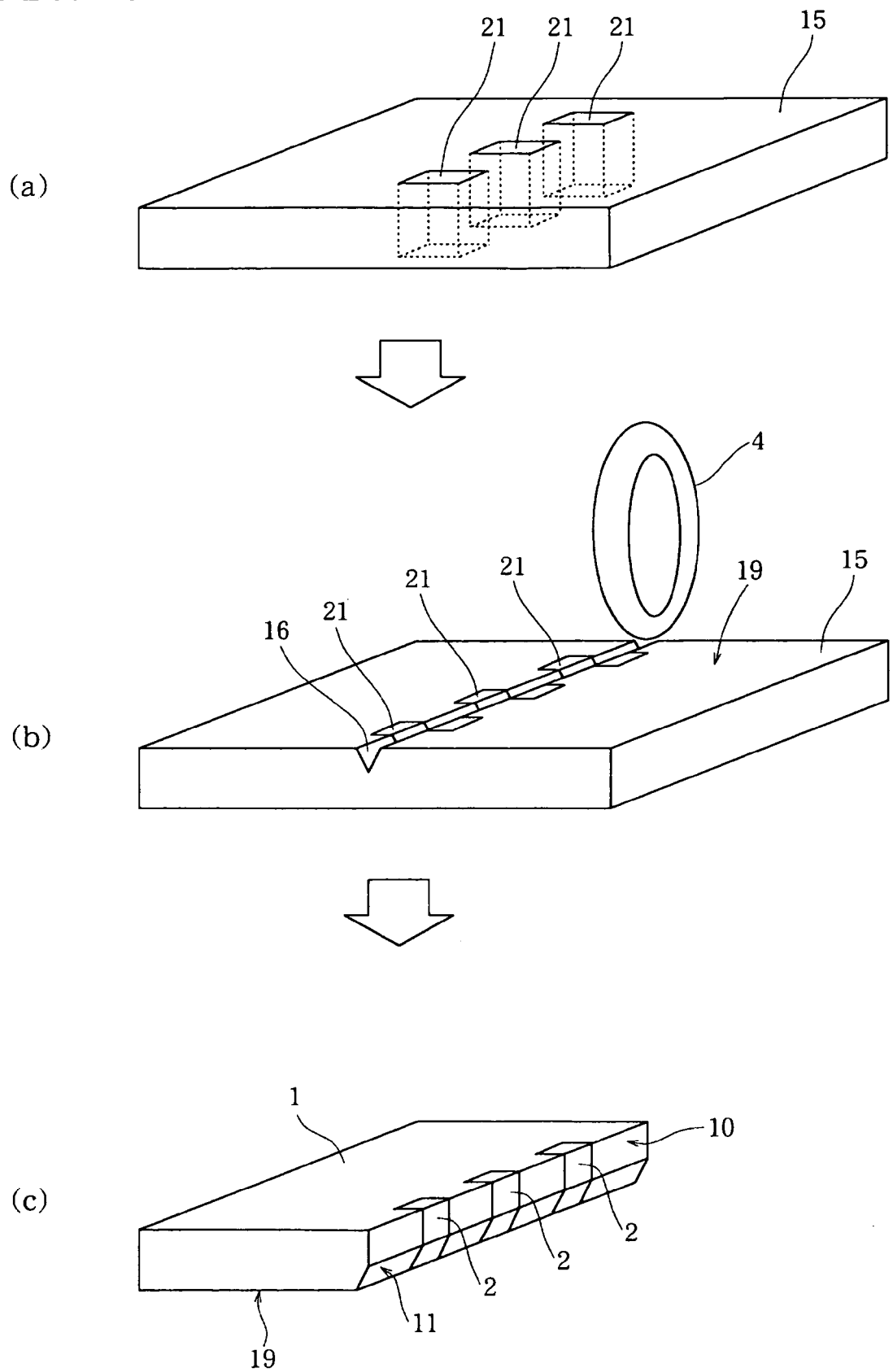
FIG. 5 is a series of perspective views illustrating a fabricating process of the base substrate of the electronic device, according to the present invention.

FIGS. 5 (a), (b), (c) show a fabricating process of the base substrate 1. In an actual fabricating process a number of base substrates 1 are fabricated at the same time, but for convenience sake of illustration, the process is described as simplified in FIGS. 5 (a), (b), (c) according to the case in which two base substrates 1 having the external electrodes 2 only on one side surface 10 are fabricated at the same time.

As shown in FIG. 5(a), for example, a base substrate board 15 comprising ceramic layers as laminated is fabricated. The base substrate board 15 has a conductor filling portion 21 formed in a quadratic prism shape to extend through the base substrate board 15, which portion 21 will serve as an external electrode 2. A plurality of conductor filling portions 21 are aligned in a row. In the case where the base substrate board 15 is provided by laminating a plurality of ceramic layers, an electronic circuit element such as an inductor pattern (not shown), etc. is preliminarily formed on a surface of each of the ceramic layers, and such electronic circuit elements are connected to each other by via holes (not shown), etc.

Subsequently, a groove along an alignment of the conductor filling portions 21 is formed on the rear surface 19 of the base substrate board 15 with a blade 4 having an edge in V-shape in cross section, to provide a V-shaped groove 16, as shown in FIG. 5(b). The V-shaped groove 16 is 300 µm in depth, and is 200 µm in width of opening.

The base substrate board 15 is thereafter cut at the deepest position of the V-shaped groove 16, to thereby obtain a base substrate 1 having a plurality of external electrodes 2 provided on the side surface 10, as shown in FIG. 5(c). The base substrate 1 has a slope 11 formed by an inner surface of the V-shaped groove 16 on the side surface 10. Exposed on the slope 11 is a surface of the external electrode 2 formed by dividing the conductor filling portion 21 into two.

Figure 6:
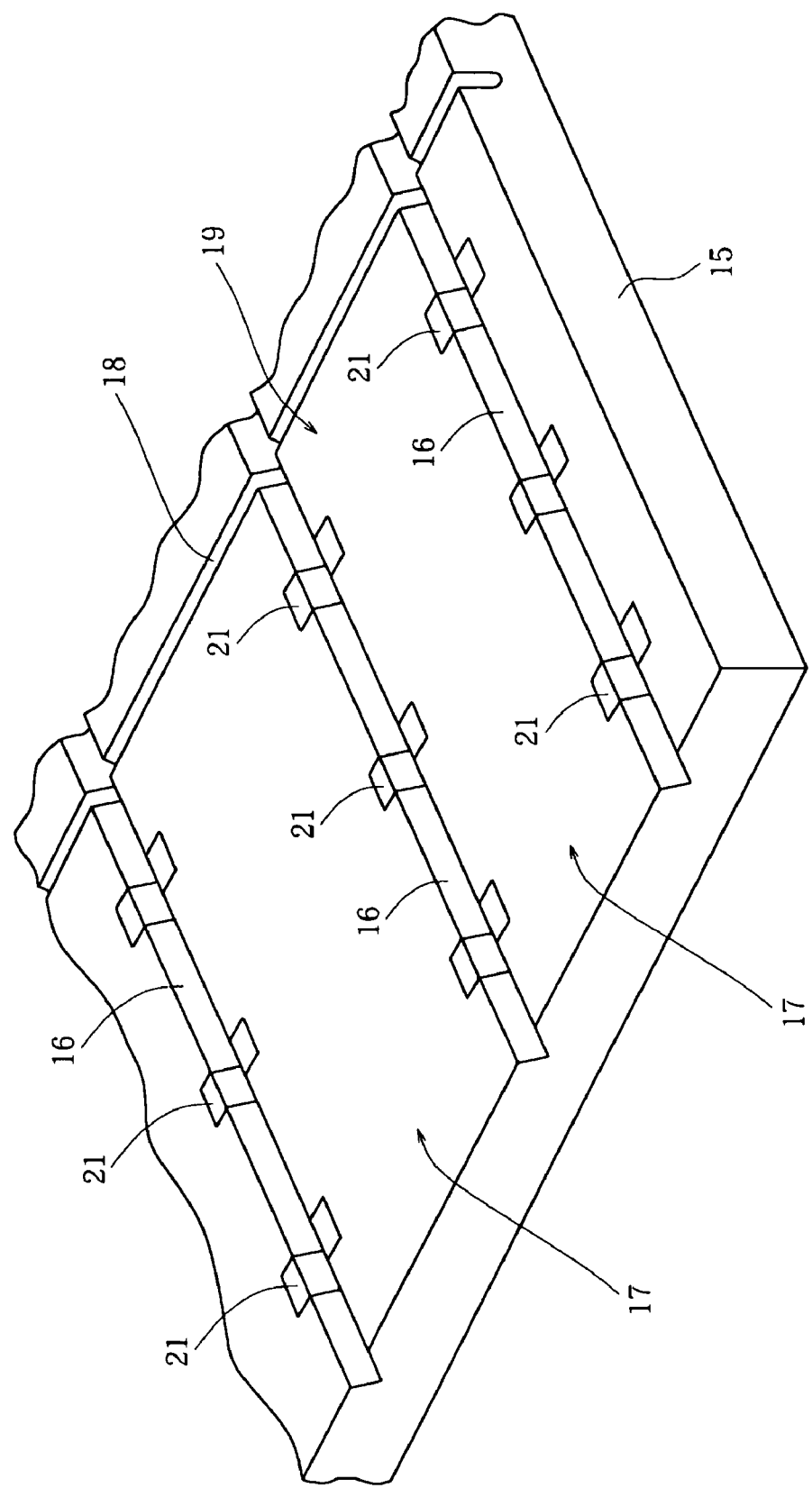
FIG. 6 is a fragmentary perspective view showing an actual base substrate board.

In the actual fabricating process, prepared is a base substrate board 15 on which a base substrate unit portion 17 serving as one base substrate is repeatedly formed on the same plane, as shown in FIG. 6. On the base substrate board 15, the conductor filling portions 21 serving as the external electrodes are each formed in the form of a post perpendicular to the rear surface 19 of the base substrate board 15 at the position of the boundary between the base substrate unit portions 17, and exposed on the rear surface 19. Furthermore, the base substrate board 15 has the rear surface 19 provided thereon with the V-shaped groove 16 extending along an alignment of the conductor filling portions 21, and a slit groove 18 extending in the direction orthogonal to the V-shaped groove 16. The surfaces of the conductor filling portions 21 are exposed on an inner surface of the V-shaped groove 16.

A plurality of chip components 7 are mounted on the surface of the base substrate board 15 every base substrate unit portion 17. The base substrate board 15 is thereafter cut along the V-shaped groove 16 and the slit groove 18, and is separated for each base substrate unit portion 17, whereby a plurality of electronic devices including the base substrate 1 as shown in FIG. 1 are obtained at the same time.

Figure 7:
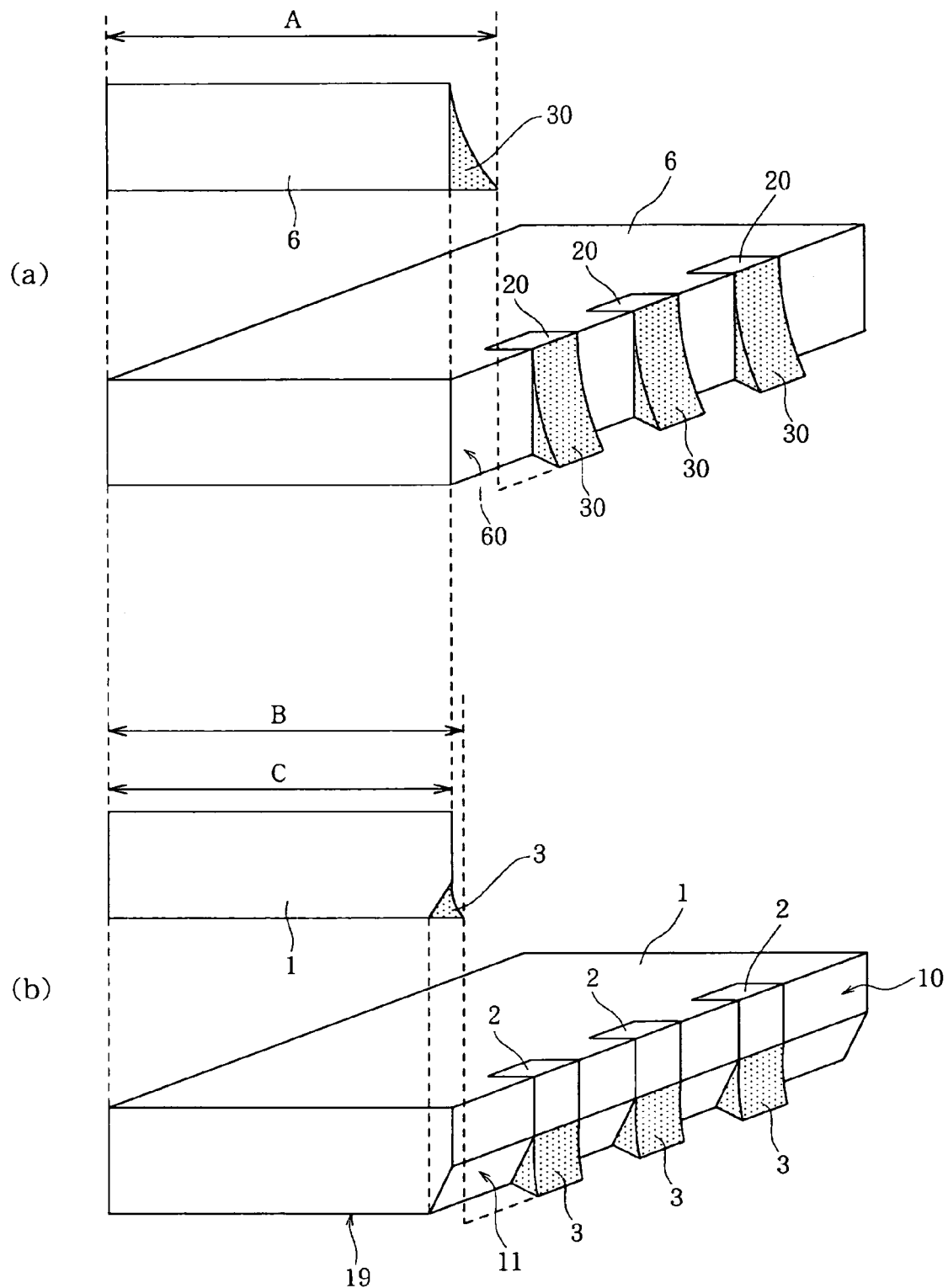
FIG. 7 is a diagram describing the comparison between the fillet construction of the conventional electronic device and that of the electronic device of the present invention.

The electronic device thus obtained is placed at a predetermined position formed thereon with a pad on the circuit board, and is soldered thereto by a reflow step. In this process, melted solder on the board adheres to the surface of the external electrode 2 exposed from the slope 11 of the base substrate 11, to form a solder fillet 3 spreading to the bottom as shown in FIG. 7(*b*). Incidentally, the surface of the external electrode 2 exposed from the slope 11 of the base substrate 11 extends consecutively from an electrode end face facing the pad on the circuit board at the same angle as the slope 11 of the base substrate 1, so that the melted solder adheres to the electrode surface over a wide area to form a firm solder fillet 3. The solder fillet 3 is almost entirely housed in a wedge-shaped space formed between the slope 11 of the base substrate 1 and the surface of the circuit board 9.

Figure 3:
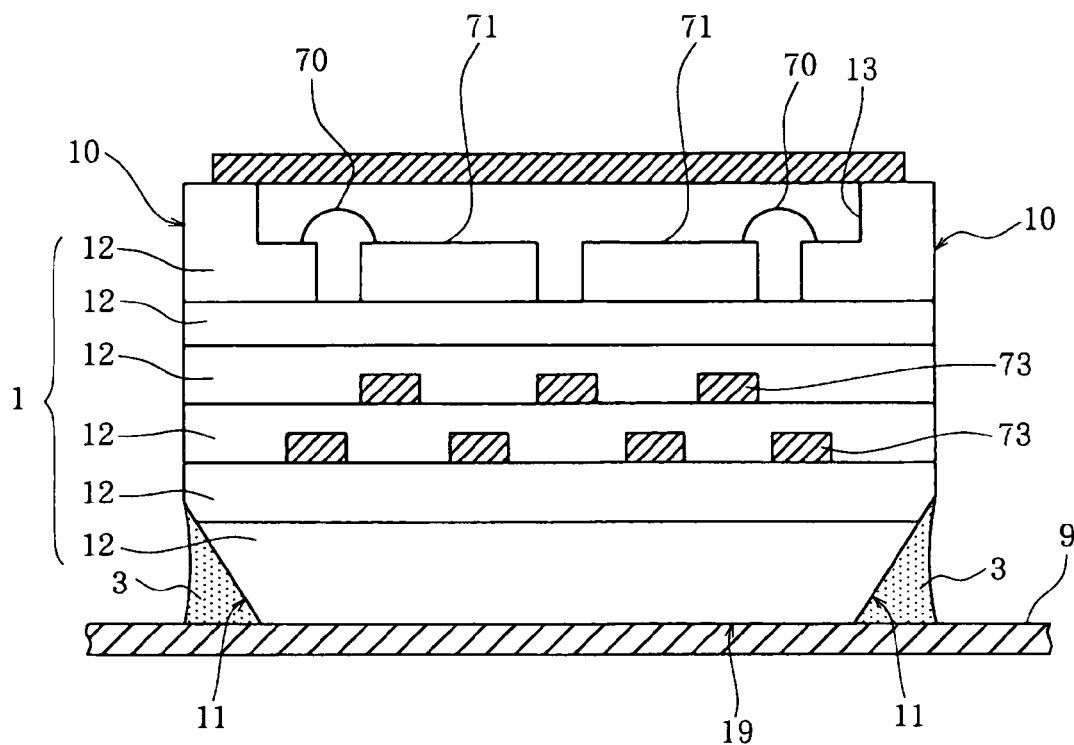
FIG. 3 is a view in section showing another electronic device according to the present invention.

FIG. 3 shows another electronic device embodying the present invention. A base substrate 1 comprising a plurality of ceramic layers 12 as laminated has a surface provided thereon with a cavity 13. The cavity 13 has chip components 71, 71 mounted on a bottom surface to give a wire bonding 70 thereto. Furthermore, intermediate ceramic layers 12 are provided thereon with circuit elements including inductor patterns and capacitor patterns. The base substrate 1 has opposite end portions each formed with a slope 11 crossing a side surface 10 and a rear surface 19 of the base substrate 1. The solder fillet 3 is almost entirely housed in a wedge-shaped space formed between the slope 11 and the surface of the circuit board 9.

Figure 4:
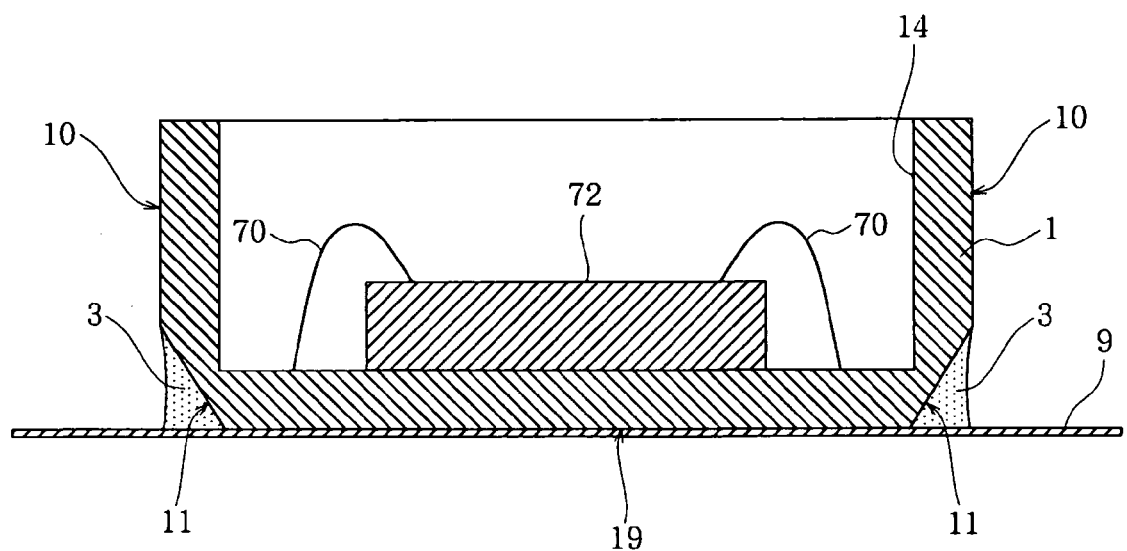
FIG. 4 is a view in section showing another electronic device, according to the present invention.

FIG. 4 shows another electronic device embodying the present invention. A cavity 14 is provided on a single-layer board made of a ceramic or synthetic resin to form a base substrate 1. The cavity 14 has chip components 72 mounted on a bottom surface thereof to give a wire bonding 70 thereto. The base substrate 1 has opposite end portions each formed with a slope 11 crossing a side surface 10 and a rear surface 19 of the base substrate 1. The solder fillet 3 is almost entirely housed in a wedge-shaped space formed between the slope 11 and the surface of the circuit board 9.

With the electronic device embodying the present invention as described above, the solder fillet 3 is almost entirely housed in an area formed between the slope 11 of the base substrate 1 and the surface of the board, as shown in FIG. 7(*b*), so that the amount of projection outward from the side surface 10 of the base substrate 1 is extremely small. Thus a surface mounting area B is made merely slightly greater than an area C of the base substrate 1, to thereby reduce greatly the conventional surface mounting area A.

The device and process of the present invention are not limited to the foregoing embodiments in construction but can be modified variously by one skilled in the art without departing from the spirit of the invention as set forth in the appended claims. For example, as shown in FIG. 8(*a*), the external electrodes 2 are arranged inwardly of the side surface 10 of the base substrate 1, and are exposed from the slope 11 to the rear surface 19 of the base substrate 1. Alternatively, as shown in FIGS. 8(*b*) and 8(*c*), a base substrate 1 comprising a plurality of ceramic layers 12 as laminated has external electrodes 2 formed only on several of the ceramic layers, and the external electrodes 2 are exposed from the slope 11 to the rear surface 19 of the base substrate 1. These arrangements have the same effect as above.

Furthermore, with the base substrate board 15 shown in FIG. 6, the conductor filling portions 21 can be aligned into two rows on opposite sides along the boundary between the base substrate unit portions 17, and a V-shaped groove 16 can be provided along the boundary. The base substrate board 15 is cut along the boundary between the base substrate unit portions 17, to thereby obtain the base substrate 1 shown in FIG. 8(*a*).

What is claimed is:

1. An electronic device comprising a base substrate to be surface-mounted on a circuit board, the base substrate having one or more electronic component elements mounted on a surface and/or therein, external electrodes each being formed in a post-shape perpendicular to a rear surface of the base substrate for connecting the one or more electronic component elements to the circuit board, the base substrate having an end portion formed with a slope crossing a side surface and the rear surface of the base substrate, the external electrodes being exposed on the slope and the rear surface of the base substrate.

2. An electronic device according to claim 1, wherein the slope is provided by one of a flat plane, polygonal plane, and curved plane, or by a combination of these planes.

3. An electronic device according to claim 1, wherein the base substrate comprises a laminate ceramic board having a plurality of ceramic layers as laminated.

4. An electronic device according to claim 1, wherein the base substrate comprises a single-layer board made of a synthetic resin or ceramic.

5. An electronic device according to claim 1, wherein a surface of the external electrode exposed on the slope of the base substrate is connected to an electrode end face facing the circuit board.

6. An electronic device according to claim 1, wherein the external electrodes have an exposed surface on the same plane as the slope of the base substrate, and have an exposed surface on the same plane as the rear surface of the base substrate, the both exposed surfaces being continuous.

7. An electronic device according to claim 1, wherein solder fillets extend from said external electrodes and are entirely housed in a wedge-shaped space between said slope of the base substrate and a surface of the circuit board so that the amount of outward projection of said solder fillets from said side surface of the base substrate is zero.

8. An intermediate product of an electronic device including a base substrate to be surface-mounted on a circuit board, one or more electronic component elements mounted on the base substrate, and a plurality of external electrodes for connecting the electronic component elements to the circuit board, the intermediate product of the electronic device comprising a base substrate board having base substrate unit portions to serve as the base substrates which portions are repeatedly formed on the same plane, the base substrate board being provided, at the boundary or in the vicinity thereof between the base substrate unit portions, with a plurality of conductor filling portions to serve as the external electrodes and each in the form of a post perpendicular to a rear surface of the base substrate board, the conductor filling portions 21 being exposed on the rear surface, the rear surface being provided thereon with a V-shaped or U-shaped groove in section for cutting partially the conductor filling portion along the boundary between the base substrate unit portions, a surface of the conductor filling portion being exposed on an inner surface of the groove, wherein the exposed surface of the conductor filling portion extends all across the groove in a width direction thereof.

\* \* \* \* \*